(12) United States Patent
Ben-Rubi

(10) Patent No.: US 11,645,009 B2
(45) Date of Patent: May 9, 2023

(54) DATA STORAGE WITH IMPROVED READ PARALLELISM

(71) Applicant: Western Digital Technologies, Inc., San Jose, CA (US)

(72) Inventor: Refael Ben-Rubi, Rosh Haayin (IL)

(73) Assignee: Western Digital Technologies, Inc., San Jose, CA (US)

( * ) Notice: Subject to any disclaimer, the term of this patent is extended or adjusted under 35 U.S.C. 154(b) by 37 days.

(21) Appl. No.: 17/191,195

(22) Filed: Mar. 3, 2021

(65) Prior Publication Data
US 2022/0283736 A1    Sep. 8, 2022

(51) Int. Cl.
```
G06F 3/06      (2006.01)
G11C 11/56     (2006.01)
G11C 16/26     (2006.01)
```
(52) U.S. Cl.
CPC .......... *G06F 3/0659* (2013.01); *G06F 3/0604* (2013.01); *G06F 3/0673* (2013.01); *G11C 11/5642* (2013.01); *G11C 16/26* (2013.01)

(58) Field of Classification Search
CPC ............... G06F 11/076; G06F 11/1048; G06F 12/0246; G06F 2212/7203; G06F 2212/7205; G06F 3/0619; G06F 3/064; G06F 3/0688
See application file for complete search history.

(56) References Cited

U.S. PATENT DOCUMENTS

| | | | |
|---|---|---|---|
| 9,135,192 B2 | 9/2015 | Lin et al. | |
| 9,652,156 B2 | 5/2017 | Alcantara et al. | |
| 9,761,326 B2 | 9/2017 | Nakanishi et al. | |
| 9,792,995 B1 | 10/2017 | Shah et al. | |
| 9,799,405 B1 | 10/2017 | Micheloni et al. | |
| 10,002,086 B1 | 6/2018 | Achtenberg et al. | |
| 10,284,233 B2 | 5/2019 | Bazarsky et al. | |
| 2012/0320672 A1* | 12/2012 | Meir ................. | G11C 13/0061 365/185.03 |
| 2015/0242268 A1 | 8/2015 | Wu et al. | |
| 2017/0031755 A1 | 2/2017 | Nakanishi et al. | |
| 2020/0192735 A1 | 6/2020 | Ioannou et al. | |

OTHER PUBLICATIONS

Wu, Guanying, Performance and Reliability Study and Exploration of NAND Flash-based Solid State Drives: A dissertation submitted in partial fulfillment of the requirements for the degree of Doctor of Philosophy at Virginia Commonwealth University, VCU, Richmond, Virginia, Aug. 2013, 120 pp.
Wu, et al, Exploiting Workload Dynamics to Improve SSD Read Latency via Differentiated Error Correction Codes, ACM Transactions on Design Automation of Electronic Systems, vol. 18, No. 4, Article 55, Pub. date: Oct. 2013, 22 pp.

\* cited by examiner

*Primary Examiner* — Yong J Choe
(74) *Attorney, Agent, or Firm* — Patterson + Sheridan, LLP; Steven H. VerSteeg

(57) ABSTRACT

A data storage device includes a memory device and a controller coupled to the memory device. The controller is configured to receive read requests from a host device. When a read request is received corresponding to one or more pages from a first plane and one or more pages from a second plane, the controller is configured to determine a decode time for the pages of the first plane and the pages of the second plane. Based on the decode times for pages of the first plane and pages of the second page, pages of the first plane that have a similar decode time to pages of the second plane are read in parallel.

20 Claims, 2 Drawing Sheets

DATA STORAGE WITH IMPROVED READ PARALLELISM

BACKGROUND OF THE DISCLOSURE

Field of the Disclosure

Embodiments of the present disclosure generally relate to data storage devices, such as solid state drives (SSDs), and read operations.

Description of the Related Art

Data storage devices may be capable of performing write, read, and erase operations to the internal memory devices of the data storage device. The internal memory devices may be flash memory, such as NAND or NOR memory. When a host device sends a write command to the data storage device, the data of the write command is programmed to a relevant internal memory device, such as a non-volatile memory (NVM). The internal memory device comprises a plurality of dies, each die comprising a first plane and a second plane, each plane comprising a plurality of blocks, and each block comprising a plurality of pages. Data storage operations on the internal memory device may operate at a block level, such that a garbage collection operation is executed on an entire block.

When a read command is received by the data storage device to read data from the internal memory device, the data associated with the read command may need to be decoded prior to transferring the data to the host device. Each parallel plane (i.e., the first plane and the second plane of each die) works together, such that two reads may occur to the same die simultaneously, where a first read is to a first page of the first plane and a second read is to a first page of the second plane. The read operation includes a sense operation, a transfer operation, and a decode operation on each page. However, the first read and the second read may not occur at the same speed because the data stored on the first page of the first plane and the first page of the second plane may not be similar. Therefore, the performance of the read operation may be impacted and the time to perform the read operation may increase.

Thus, there is a need in the art for an improved parallel read operation.

SUMMARY OF THE DISCLOSURE

The present disclosure generally relates to data storage devices, such as solid state drives (SSDs), and read operations. A data storage device includes a memory device and a controller coupled to the memory device. The controller is configured to receive read requests from a host device. When a read request is received corresponding to one or more pages from a first plane and one or more pages from a second plane, the controller is configured to determine a decode time for the pages of the first plane and the pages of the second plane. Based on the decode times for pages of the first plane and pages of the second page, pages of the first plane that have a similar decode time to pages of the second plane are read in parallel.

In one embodiment, a data storage device includes a memory device and a controller coupled to the memory device. The controller is configured to receive a first read request, wherein the first read request includes reading from a plurality of pages of a first plane and a second plane, determine a decode time for the first plane and the second plane of each page of the plurality of pages of the first read request, select a first decode time from the first plane, where the first decode time corresponds to a first address, select a second decode time from the second plane, where the second decode time corresponds to a second address, and where the second decode time is closest in length to the first decode time compared to a decode time of the other determined decode times, and perform parallel reads of the first address and the second address.

In another embodiment, a data storage device includes a memory device and a controller coupled to the memory device. The controller is configured to receive a read request, where the read request includes reading from a plurality of pages of a first plane and a second plane, and determine that the read request includes: reading a first address from the first plane of a first page, reading a second address from the second plane of the first page, reading a third address from the first plane of a second page, and reading a fourth address from the second plane of the second page. The controller is further configured to perform parallel reads of the first address and the fourth address and perform parallel reads of the third address and the second address.

In another embodiment, a data storage device includes memory means, means to determine similar decode times for different planes for read requests, and means to arrange parallel reads to decrease total read request processing time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and read operations. A data storage device includes a memory device and a controller coupled to the memory device. The controller is configured to receive read requests from a host device. When a read request is received corresponding to one or more pages from a first plane and one or more pages from a second plane, the controller is configured to determine a decode time for the pages of the first plane and the pages of the second plane. Based on the decode times for pages of the first plane and pages of the second page, pages of the first plane that have a similar decode time to pages of the second plane are read in parallel.

Figure 1:
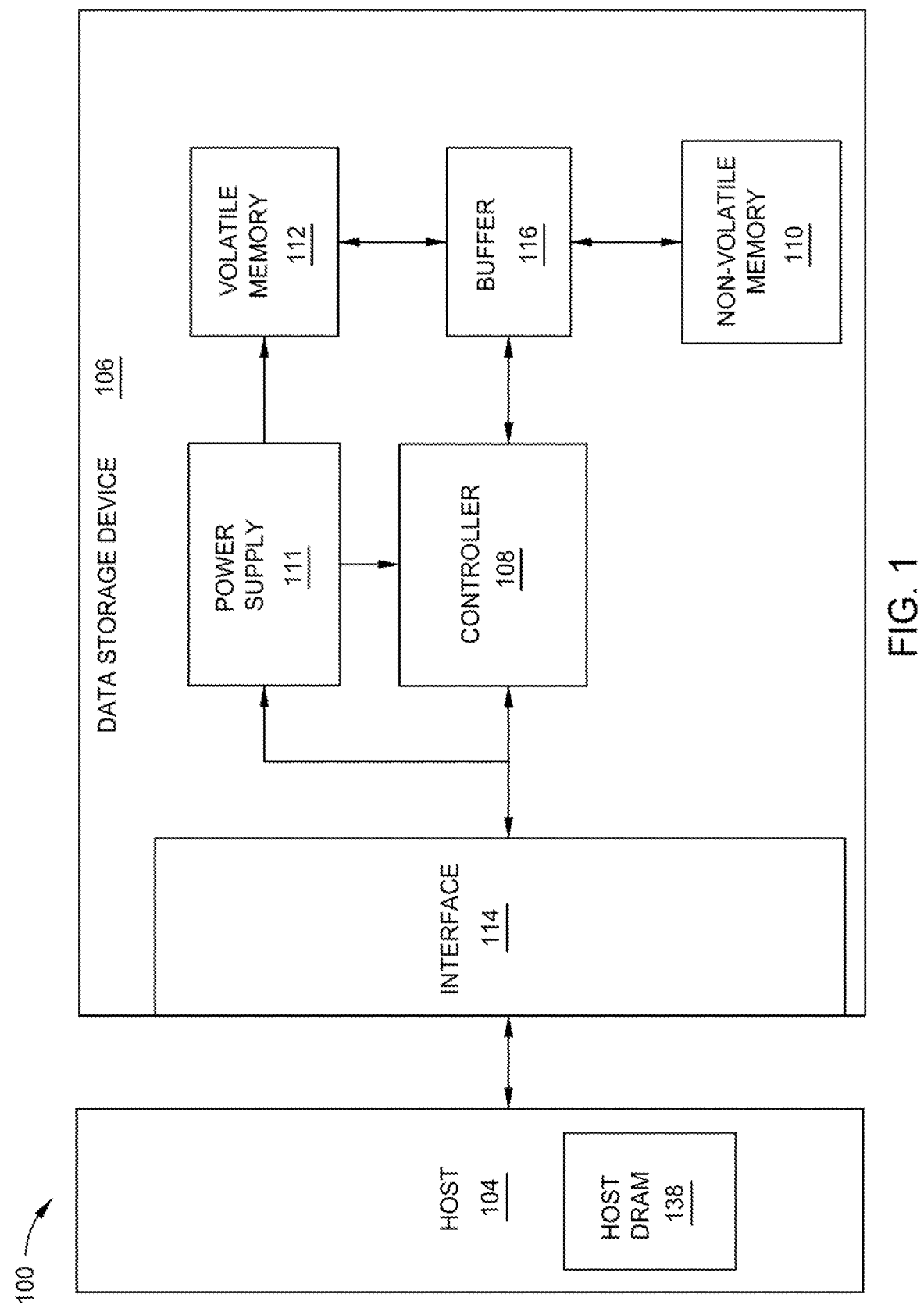
FIG. 1 depicts a schematic block diagram illustrating a storage system in which data storage device may function as a storage device for a host device, according to certain embodiments.

FIG. 1 depicts a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
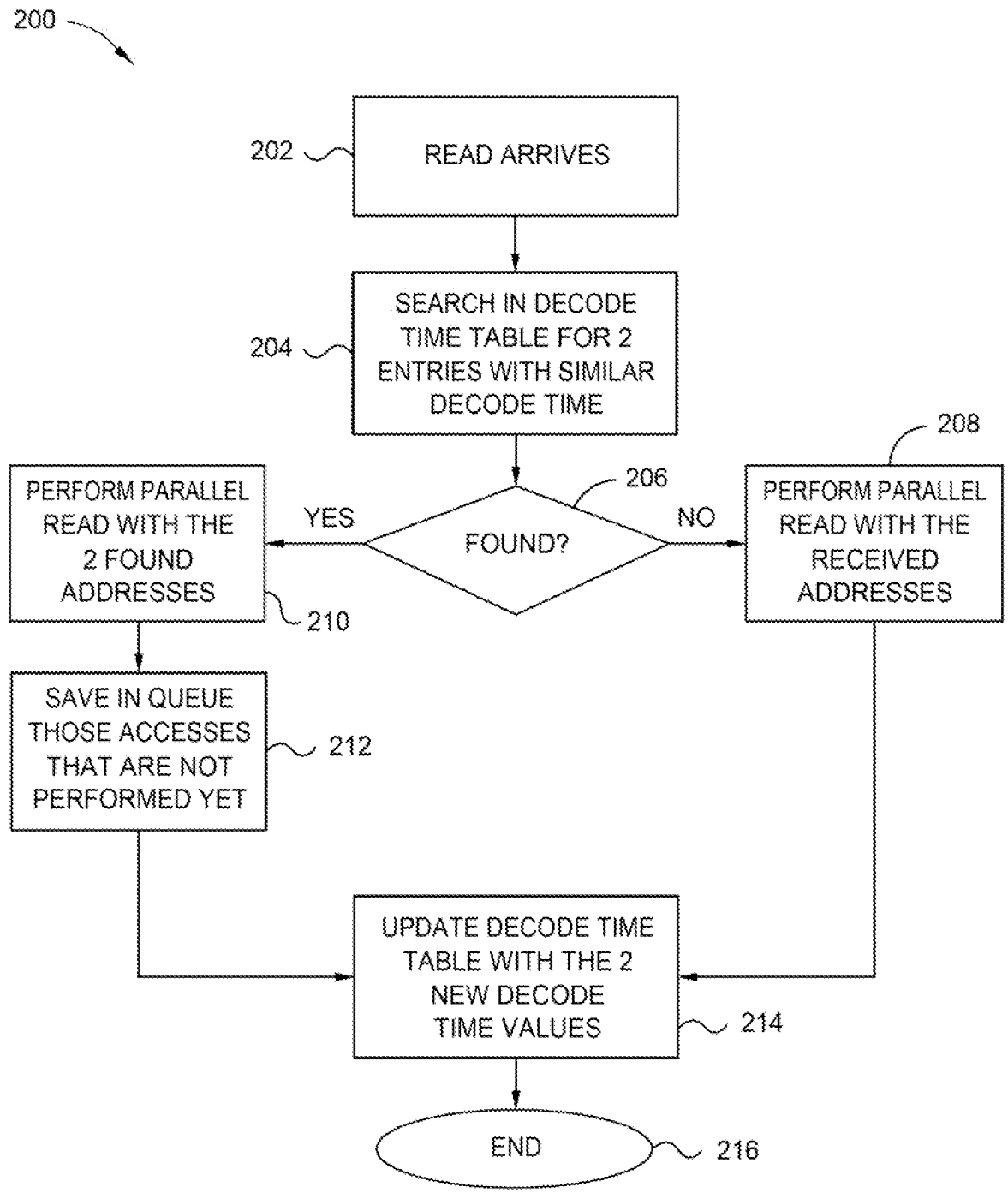
FIG. 2 is a flowchart illustrating a method of performing a read operation, according to certain embodiments.

FIG. 2 is a flowchart illustrating a method 200 of performing a read operation, according to certain embodiments. Aspects of the storage system 100 may be utilized in the description of the method 200 for exemplary purposes. For example, references to a controller may be made towards the controller 108.

At block 202, a read command is generated by the host device 104 and retrieved by the controller 108. If the read command is a size larger than about 32 logical block addresses (LBAs), then the read command is a read operation to read from pages of a first plane and pages of a second plane. However, if the read command is a size larger than about 32 LBAs, then the read command is a read operation to read from a single plane. The previously listed size values is not intended to be limiting, but to provide an example of a possible embodiment. Furthermore, it is contemplated that a read command may include a read from the first plane and the second plane without being larger than the about 32 LBA size.

At block 204, the controller 108 searches a decode time table for two entries with a similar decode time, wherein a first entry of the two entries is for the first plane and a second entry of the two entries is for the second plane. It is contemplated that the two entries could be in the same plane. The decode time table stores decode times determined during a decode operation of a read operation or a decode operation completed after an encode operation of a program operation. For example, when reading data of the first plane for a first time, the data is decoded. Each page that is decoded is associated with a decode time. The decode time of each page of the first plane is then stored in the decode time table. Prior to storing the decode times for the first time, the decode time table may store generic or pre-defined values for decode times. In other embodiments, the decode time table may be empty prior to storing the decode times for the first time.

In another example, during a program operation, the encoded data may be decoded prior or at the same time as programming to the NVM 110. The decode time determined by the decode operation after encoding the data is then stored in the decode time table. Furthermore, the controller 108 may be configured to predict the decode times of each page using similar pages as references. For example, if a first page has similar data to a second page, then the first page and the second page decode times may be similar. The decode time table may be stored in volatile memory, such as the volatile memory 112 of FIG. 1. In one examples, the decode time table may be stored in a volatile memory in the controller 108. In another example, the decode time table may be stored in a controller memory buffer (CMB) or a host memory buffer (HMB).

The decode times in the decode table may be for single level cell (SLC) memory, multi level cell (MLC) memory, triple level cell (TLC) memory, quad level cell memory (QLC), and other iterations of level cell memory. Furthermore, the decode times selected are for parallel planes of the same memory type, such that a SLC memory plane is compared to a parallel SLC memory plane and a TLC memory plane is compared to a parallel TLC memory plane. It is contemplated that there may be a plurality of decode time tables or a single decode time table storing the decode times. Table 1 is an example of decode time table including example values.

TABLE 1

| Page | Plane 0 - Decode Time (clocks) | Plane 1 - Decode Time (clocks) |
|---|---|---|
| 72 | 2120 | 1992 |
| 5 | 4123 | 2548 |
| 23 | 3185 | 3485 |
| 18 | 2197 | 2397 |
| 64 | 1825 | 2242 |
| 92 | 1722 | 4123 |
| 4 | 2548 | 1925 |
| 6 | 2142 | 2542 |

The controller 108 may be configured to determine which decode times of the pages of the first plane are similar or not sufficiently similar in decode times to the decode times of the pages of the second plane. For example, page 5 of plane 0 has a decode time of 4123 clocks and page 92 of plane 1 has a decode time of 4123 clocks. Because the two decode times are the same, the pages of each plane are selected to be read in parallel. Although the current example exemplifies a same decode time, the decode times selected may be similar decode times. For example, the similar decode times may be a comparison between the decode time of a page of the first plane and the decode time of a page of the second plane. The comparison may include determining, by the controller 108, that the decode time of a page of the first plane has a value closest or a least difference in decode time to a decode time of a page of the second plane.

For example, for page 18 of plane 0, a similar decode time may be page 64 of plane 1, where the difference in decode times is 45 clocks. In some examples, choosing a similar decode time between a page of the first plane and another page of the second plane may include determining if the decode times are within a certain percentage of each other. For example, the certain percentage may be about 10%. In other examples, the certain percentage may be between about 0% and about 20%. When the decode times are more similar (i.e., closer together in value or equal), the decode operation may not be bottlenecked by waiting on the slower of the two decode times to finish decoding.

At block 206, the controller determines if a similar decode time of a page of the first plane and a page of the second plane is found in the decode time table, where the pages selected are for a queued request or the currently executed request. If there is not a similar decode time in the decode time table, then at block 208, the controller 108 is configured to perform the parallel read with the received addresses. However, if there is a similar decode time in the decode time table, then at block 210, the controller 108 is configured to perform a parallel read with the selected similar decode time addresses or pages.

For example, in the example presented above, because page 5 of plane 0 has a decode time of 4123 clocks and page 92 of plane 1 has a decode time of 4123 clocks, page 5 of plane 0 and page 92 of plane 1 are read in parallel. Likewise, page 18 of plane 0 and page 64 of plane 1 has a similar decode time and are read in parallel. At block 212, the accesses or the requests that have not been completed are saved in a queue, such as in the buffer 116 or in an internal memory of the controller 108.

At block 214, the decode time table is updated with the new decode values for the previously decoded pages. For example, because page 5 of plane 0 and page 92 of plane 1 were decoded at block 210, an updated decode time is determined for each of the pages and the respective decode times in the decode time table are updated. Furthermore, if a parallel read was completed with the received addresses at block 208, then at block 214, the decode times of the pages read are loaded or updated in the decode time table. At block 216, the method 200 of performing the read operation is completed.

In one example, the queue depth is equal to one. For a SLC memory, the sense time is about 25 μsec and the transfer time for 4K bytes is about 4 μsec. In a first embodiment, the data being decoded includes a large amount of errors. Because of the errors, the decode time is longer than decoding data without or with less errors than the data being decoded. The decode time may be about 5 μsec. The decode time of the less errors or a minimal amount of errors may be about 2 μsec. In the case of not matching decode times of a page with a page of the parallel plane, the decode time used is the about 5 μsec. However, when matching the decode times, the decode time used is the about 2 μsec. For a 4K flash management unit (FMU), the non-matched decode time results in a read performance of about 120.5 MB/sec. However, in the case of the matched decode time, the read performance is about 132.1 MB/sec. Therefore, matching similar decode times of a page with another page of a parallel plane may result in an increased read performance.

By selecting pages on parallel planes with similar decode times to be decoded in parallel, the speed at which a read operation may occur may be improved and the read operation may be more optimized.

In one embodiment, a data storage device includes a memory device and a controller coupled to the memory device. The controller is configured to receive a first read request, wherein the first read request includes reading from a plurality of pages of a first plane and a second plane, determine a decode time for the first plane and the second plane of each page of the plurality of pages of the first read request, select a first decode time from the first plane, where the first decode time corresponds to a first address, select a second decode time from the second plane, where the second decode time corresponds to a second address, and where the second decode time is closest in length to the first decode time compared to a decode time of the other determined decode times, and perform parallel reads of the first address and the second address.

The determining includes searching a decode time table. The parallel reads includes decoding data from the first address and the second address. The controller is further configured to update the decode time table with new decode time for the first address and the second address. The controller is configured to select a third decode time from the first plane, where the third decode time corresponds to a third address, and select a fourth decode time from the second plane, where the fourth decode time corresponds to a fourth address, and where the fourth decode time is closest in length to the third decode time compared to a decode time of remaining decode times. The first decode time and the second decode time are within 0-10 percent of each other. The first address and the second address are on a different page index. The first address and the second address are disposed in triple level cell (TLC) memory of the memory device. The controller is configured to receive a second read request, where the second read request comprises reading from the plurality of pages, where the second read request comprises reading from a plurality of addresses, and perform parallel reads with the plurality of addresses, where the parallel reads comprise reading from two planes on the same page in parallel.

In another embodiment, a data storage device includes a memory device and a controller coupled to the memory device. The controller is configured to receive a read request, where the read request includes reading from a plurality of pages of a first plane and a second plane, and determine that the read request includes: reading a first address from the first plane of a first page, reading a second address from the second plane of the first page, reading a third address from the first plane of a second page, and reading a fourth address from the second plane of the second page. The controller is further configured to perform parallel reads of the first address and the fourth address and perform parallel reads of the third address and the second address.

The performing parallel reads of the first address and the fourth address includes performing a first decode operation of data from the first address for a first period of time and a second decode operation of data from the fourth address for a second period of time. The performing parallel reads of the third address and the second address comprises performing a third decode operation of data from the third address for a third period of time and a fourth decode operation of data from the second address for a fourth period of time. The fourth period of time is greater than the first period of time, where the second period of time is equal to or greater than the first period of time, and where the second period of time is less than the fourth period of time. The third period of time is greater than the first period of time. The fourth period of time is equal to or greater than the third period of time. The controller is configured to determine that a predicted difference between the second period of time and the first period of time is less than a predicted difference between the fourth period of time and the first period of time. The controller is configured to arrange the first address and the fourth address to be read in parallel based upon determining the predicted differences. The data storage device further includes maintaining a table of decode times for the first address, the second address, the third address, and the fourth address. The first address and the second address are disposed in single level cell (SLC) memory of the memory device. The controller is configured to determine that read addresses of a read request are not sufficiently similar in decode time.

In another embodiment, a data storage device includes memory means, means to determine similar decode times for different planes for read requests, and means to arrange parallel reads to decrease total read request processing time.

The means to determine comprises means to maintain a table containing decode operations times for one or more addresses in the memory means. The data storage device further includes means to perform parallel reads in both single level cell (SLC) memory and triple level cell (TLC) memory.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
receive a first read request, wherein the first read request comprises reading from a plurality of pages of a first plane and a second plane;
determine a decode time for each page of the plurality of pages of the first plane and the second plane corresponding to the first read request, wherein the decode time of each page of the plurality of pages of the first plane and the second plane corresponding to the first read request are previously determined decode times;
select a first decode time from the first plane, wherein the first decode time corresponds to a first address;
select a second decode time from the second plane, wherein the second decode time corresponds to a second address, and wherein the second decode time is closest in length to the first decode time compared to a decode time of the other determined decode times; and
perform parallel reads of the first address and the second address.

2. The data storage device of claim 1, wherein the determining comprises searching a decode time table.

3. The data storage device of claim 1, wherein the first decode time and the second decode time are within 0-10 percent of each other.

4. The data storage device of claim 1, wherein the first address and the second address are on a different page index.

5. The data storage device of claim 1, wherein the first address and the second address are disposed in triple level cell (TLC) memory of the memory device.

6. A data storage device, comprising:
a memory device; and
a controller coupled to the memory device, wherein the controller is configured to:
receive a first read request, wherein the first read request comprises reading from a plurality of pages of a first plane and a second plane;
determine a decode time for the first plane and the second plane of each page of the plurality of pages of the first read request, wherein the determining comprises searching a decode time table;
select a first decode time from the first plane, wherein the first decode time corresponds to a first address;
select a second decode time from the second plane, wherein the second decode time corresponds to a second address, and wherein the second decode time is closest in length to the first decode time compared to a decode time of the other determined decode times; and
perform parallel reads of the first address and the second address, wherein the parallel reads comprises decoding data from the first address and the second address, wherein the controller is further configured to update the decode time table with new decode time for the first address and the second address.

7. A data storage device, comprising:
a memory device; and
a controller coupled to the memory device, wherein the controller is configured to:
receive a first read request, wherein the first read request comprises reading from a plurality of pages of a first plane and a second plane;
determine a decode time for the first plane and the second plane of each page of the plurality of pages of the first read request;
select a first decode time from the first plane, wherein the first decode time corresponds to a first address;
select a second decode time from the second plane, wherein the second decode time corresponds to a second address, and wherein the second decode time is closest in length to the first decode time compared to a decode time of the other determined decode times;
perform parallel reads of the first address and the second address;
select a third decode time from the first plane, wherein the third decode time corresponds to a third address; and
select a fourth decode time from the second plane, wherein the fourth decode time corresponds to a fourth address, and wherein the fourth decode time is closest in length to the third decode time compared to a decode time of remaining decode times.

8. A data storage device, comprising:
a memory device; and
a controller coupled to the memory device, wherein the controller is configured to:
receive a first read request, wherein the first read request comprises reading from a plurality of pages of a first plane and a second plane;
determine a decode time for the first plane and the second plane of each page of the plurality of pages of the first read request;

select a first decode time from the first plane, wherein the first decode time corresponds to a first address;
select a second decode time from the second plane, wherein the second decode time corresponds to a second address, and wherein the second decode time is closest in length to the first decode time compared to a decode time of the other determined decode times;
perform parallel reads of the first address and the second address;
receive a second read request, wherein the second read request comprises reading from the plurality of pages, wherein the second read request comprises reading from a plurality of addresses; and
perform parallel reads with the plurality of addresses, wherein the parallel reads comprise reading from two planes on the same page in parallel.

9. A data storage device, comprising:
a memory device; and
a controller coupled to the memory device, wherein the controller is configured to:
receive a read request, wherein the read request comprises reading from a plurality of pages of a first plane and a second plane;
determine that the read request comprises:
reading a first address from the first plane of a first page;
reading a second address from the second plane of the first page;
reading a third address from the first plane of a second page; and
reading a fourth address from the second plane of the second page;
perform parallel reads of the first address and the fourth address; and
perform parallel reads of the third address and the second address, wherein performing parallel reads of the first address and the fourth address and performing parallel reads of the third address and the second address comprises:
determining that a decode time of the first address and the fourth address is closest in decoding time length compared to other decoding time lengths of other addresses of the first page and the second page; and
determining that a decode time of the third address and the second address is next closest in decoding time length compared to other decoding time lengths of other addresses of the first page and the second page.

10. The data storage device of claim 9, further comprising maintaining a table of decode times for the first address, the second address, the third address, and the fourth address.

11. The data storage device of claim 9, wherein the first address and the second address are disposed in single level cell (SLC) memory of the memory device.

12. The data storage device of claim 9, wherein the controller is configured to determine that read addresses of a read request are not sufficiently similar in decode time.

13. A data storage device, comprising:
a memory device; and
a controller coupled to the memory device, wherein the controller is configured to:
receive a read request, wherein the read request comprises reading from a plurality of pages of a first plane and a second plane;
determine that the read request comprises:
reading a first address from the first plane of a first page;
reading a second address from the second plane of the first page;
reading a third address from the first plane of a second page; and
reading a fourth address from the second plane of the second page;
perform parallel reads of the first address and the fourth address, wherein performing parallel reads of the first address and the fourth address comprises performing a first decode operation of data from the first address for a first period of time and a second decode operation of data from the fourth address for a second period of time; and
perform parallel reads of the third address and the second address, wherein performing parallel reads of the third address and the second address comprises performing a third decode operation of data from the third address for a third period of time and a fourth decode operation of data from the second address for a fourth period of time.

14. The data storage device of claim 13, wherein the fourth period of time is greater than the first period of time, wherein the second period of time is equal to or greater than the first period of time, and wherein the second period of time is less than the fourth period of time.

15. The data storage device of claim 13, wherein the third period of time is greater than the first period of time, and wherein the fourth period of time is equal to or greater than the third period of time.

16. The data storage device of claim 13, wherein the controller is configured to determine that a predicted difference between the second period of time and the first period of time is less than a predicted difference between the fourth period of time and the first period of time.

17. The data storage device of claim 16, wherein the controller is configured to arrange the first address and the fourth address to be read in parallel based upon determining the predicted differences.

18. A data storage device, comprising:
memory means;
means to determine similar decode times between one or more pages of a first plane and one or more pages of a second plane for read requests, wherein each decode time of the one or more pages of the first plane and each decode time of the one or more pages of the second plane are previously determined decode times; and
means to arrange parallel reads between a page of the first plane and a page of the second plane based on the determining in order to decrease total read request processing time, wherein the arranging comprises selecting a first decode time corresponding to the page of the first plane that is closest to in a decode length of time to a second decode time corresponding to the page of the second plane.

19. The data storage device of claim 18, wherein the means to determine comprises means to maintain a table containing decode operations times for one or more addresses in the memory means.

20. The data storage device of claim 18, further comprising means to perform parallel reads in both single level cell (SLC) memory and triple level cell (TLC) memory.

* * * * *